United States Patent
Hasebe et al.

(10) Patent No.: US 7,427,572 B2
(45) Date of Patent: Sep. 23, 2008

(54) METHOD AND APPARATUS FOR FORMING SILICON NITRIDE FILM

(75) Inventors: Kazuhide Hasebe, Minamialps (JP); Mitsuhiro Okada, Kai (JP)

(73) Assignee: Tokyo Electron Limited, Tokyo (JP)

( * ) Notice: Subject to any disclaimer, the term of this patent is extended or adjusted under 35 U.S.C. 154(b) by 314 days.

(21) Appl. No.: 11/186,892

(22) Filed: Jul. 22, 2005

(65) Prior Publication Data

US 2006/0068606 A1  Mar. 30, 2006

(30) Foreign Application Priority Data

Jul. 27, 2004 (JP) ............... 2004-219341
Jun. 13, 2005 (JP) ............... 2005-173036

(51) Int. Cl.
*H01L 21/31* (2006.01)

(52) U.S. Cl. ............. 438/777; 438/775; 257/E21.302

(58) Field of Classification Search ............... 438/791, 438/775, 776, 777; 257/E21.302
See application file for complete search history.

(56) References Cited

U.S. PATENT DOCUMENTS

| | | | | |
|---|---|---|---|---|
| 5,674,783 A | * | 10/1997 | Jang et al. | 438/697 |
| 5,714,399 A | * | 2/1998 | Hisatomi et al. | 438/261 |
| 5,840,600 A | * | 11/1998 | Yamazaki et al. | 438/151 |
| 6,346,302 B2 | * | 2/2002 | Kishimoto et al. | 427/569 |
| 6,776,847 B2 | * | 8/2004 | Yamazaki et al. | 118/724 |
| 6,844,273 B2 | * | 1/2005 | Kato et al. | 438/791 |
| 2002/0052124 A1 | * | 5/2002 | Raaijmakers et al. | 438/778 |
| 2002/0192885 A1 | * | 12/2002 | Miyasaka | 438/164 |
| 2003/0038127 A1 | * | 2/2003 | Liu et al. | 219/390 |

FOREIGN PATENT DOCUMENTS

JP  2004-6801  1/2004

* cited by examiner

*Primary Examiner*—Scott B. Geyer
*Assistant Examiner*—Seahvosh J Nikmanesh
(74) *Attorney, Agent, or Firm*—Oblon, Spivak, McClelland, Maier & Neustadt, P.C.

(57) ABSTRACT

A method for forming a silicon nitride film first deposits a silicon nitride film on a target substrate by CVD in a process field within a reaction container. This step is arranged to supply a first process gas containing a silane family gas and a second process gas containing a nitriding gas to the process field, and set the process field at a first temperature and a first pressure, for a first time period. The method then nitrides a surface of the silicon nitride film in the process field. This step is arranged to supply a surface-treatment gas containing a nitriding gas to the process field without supplying the first process gas, and set the process field at a second temperature and a second pressure, for a second time period shorter than the first time period.

15 Claims, 6 Drawing Sheets

METHOD AND APPARATUS FOR FORMING SILICON NITRIDE FILM

CROSS-REFERENCE TO RELATED APPLICATIONS

This application is based upon and claims the benefit of priority from prior Japanese Patent Applications No. 2004-219341, filed Jul. 27, 2004; and No. 2005-173036, filed Jun. 13, 2005, the entire contents of both of which are incorporated herein by reference.

BACKGROUND OF THE INVENTION

1. Field of the Invention

The present invention relates to a method and apparatus for forming a silicon nitride film on a target substrate, such as a semiconductor wafer, and particularly to a film formation technique used for a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. Jpn. Pat. Appln. KOKAI Publication No. 2004-6801 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat-process is performed, while the process conditions, such as process gas flow rate, process pressure, and process temperature, are controlled.

In recent years, owing to the demands of increased integration and miniaturization of semiconductor integrated circuits, it is required to alleviate the thermal history of semiconductor devices in manufacturing steps (in consideration of the heat resistance property of film formation materials), thereby improving the characteristics of the devices. For vertical processing apparatuses, it is also required to improve semiconductor processing methods in accordance with the demands described above. For example, recently, there is a tendency to use film formation gases easy to thermally decompose at a relatively low temperature, which are known to include, e.g., HCD (hexachlorodisilane) and DCS (dichlorosilane).

For example, where HCD is used to form an insulating film of silicon nitride (SiN), HCD gas and ammonia gas are supplied at the same time into a process field within a reaction container being vacuum-exhausted. Further, the process field is heated at, e.g., about 500° C. to cause thermal decomposition reaction of the process gas, thereby forming a silicon nitride film on a semiconductor wafer by CVD (chemical vapor deposition). Silicon nitride films thus formed are frequently used as, e.g., a contact stopper film. Where HCD gas is used in a film formation process, the process can be performed at a relatively low temperature. In this case, there is an advantage in that film materials formed in previous steps suffer less thermal damage. However, the present inventors have found that silicon nitride films thus formed may generate particles.

BRIEF SUMMARY OF THE INVENTION

An object of the present invention is to provide a method and apparatus for forming a silicon nitride film, which can suppress particle generation from the silicon nitride film.

According to a first aspect of the present invention, there is provided a method for forming a silicon nitride film, comprising:

depositing a silicon nitride film on a target substrate by CVD in a process field within a reaction container, while supplying a first process gas containing a silane family gas and a second process gas containing a nitriding gas to the process field, and setting the process field at a first temperature and a first pressure, for a first time period; and nitriding a surface of the silicon nitride film in the process field, while supplying a surface-treatment gas containing a nitriding gas to the process field without supplying the first process gas, and setting the process field at a second temperature and a second pressure, for a second time period shorter than the first time period.

According to a second aspect of the present invention, there is provided an apparatus for forming a silicon nitride film, comprising:

a process container having a process field configured to accommodate a target substrate;

a support member configured to support the target substrate inside the process field;

a heater configured to heat the target substrate inside the process field;

an exhaust system configured to exhaust gas inside the process field;

a first process gas supply circuit configured to supply a first process gas containing a silane family gas to the process field;

a second process gas supply circuit configured to supply a second process gas containing a nitriding gas to the process field;

a surface-treatment gas supply circuit configured to supply a surface-treatment gas containing a nitriding gas to the process field; and a control section configured to control an operation of the apparatus, wherein the control section executes depositing a silicon nitride film on a target substrate by CVD in the process field, while supplying the first process gas and the second process gas to the process field, and setting the process field at a first temperature and a first pressure, for a first time period; and nitriding a surface of the silicon nitride film in the process field, while supplying the surface-treatment gas to the process field without supplying the first process gas, and setting the process field at a second temperature and a second pressure, for a second time period shorter than the first time period.

According to a third aspect of the present invention, there is provided a computer readable medium containing program instructions for execution on a processor, which, when executed by the processor, cause an apparatus for forming a silicon nitride film to execute depositing a silicon nitride film on a target substrate by CVD in a process field within a reaction container, while supplying a first process gas containing a silane family gas and a second process gas containing a nitriding gas to the process field, and setting the process field at a first temperature and a first pressure, for a first time period; and nitriding a surface of the silicon nitride film in the process field, while supplying a surface-treatment gas containing a nitriding gas to the process field without supplying the first process gas, and setting the process field at a second temperature and a second pressure, for a second time period shorter than the first time period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the process of developing the present invention, the inventors studied problems concerning conventional methods of forming a silicon nitride film by CVD. As a result, the inventors have arrived at the findings given below.

Where a silicon nitride film is formed on a semiconductor wafer by conventional CVD methods, hardly any particles are observed by inspection on the wafer surface immediately after the film formation. However, after the wafer is placed in clean air for a long time period, such as several hours, tens of thousands of particles or particle-like deposition appears on the wafer surface. This phenomenon can be observed even where the wafer with such a formed film is placed in clean air having a very high cleanliness level.

In order to study this problem, a silicon nitride film was formed on a semiconductor wafer by a conventional CVD method, and, immediately thereafter, the wafer was airtightly contained in a small container, SMIF BOX (TM), filled with an inactive gas, such as $N_2$ gas, and the state thereof was observed. As a result, the particle generation described above was essentially not observed in the SMIF BOX. However, at the moment when the wafer was taken out of the SMIF BOX into clean air, it was observed that the particles described above were abruptly generated on the wafer surface. In other words, it has been found that the problem described above about particle generation cannot be solved even if the SMIF BOX is used as wafer standby means in semiconductor processes.

Further studying this problem, it has been found that silicon nitride films formed by conventional methods cause degasification from the surface, and thereby generate gases containing, e.g., SiH or $SiH_2$ as the main component, which then react with oxygen or the like and form particles. Specifically, the problem about particle generation is caused by gas components generated due to insufficient nitridation of the surface of the silicon nitride film. In this respect, where the surface of the silicon nitride film is further subjected to a nitridation treatment, until most of the Si—H bonds on the surface are changed to Si—N bonds, the surface can be essentially free from residual gas components. Consequently, when the silicon nitride film is exposed to atmosphere, no degasification occurs, thereby preventing particle generation on the wafer surface.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 1:
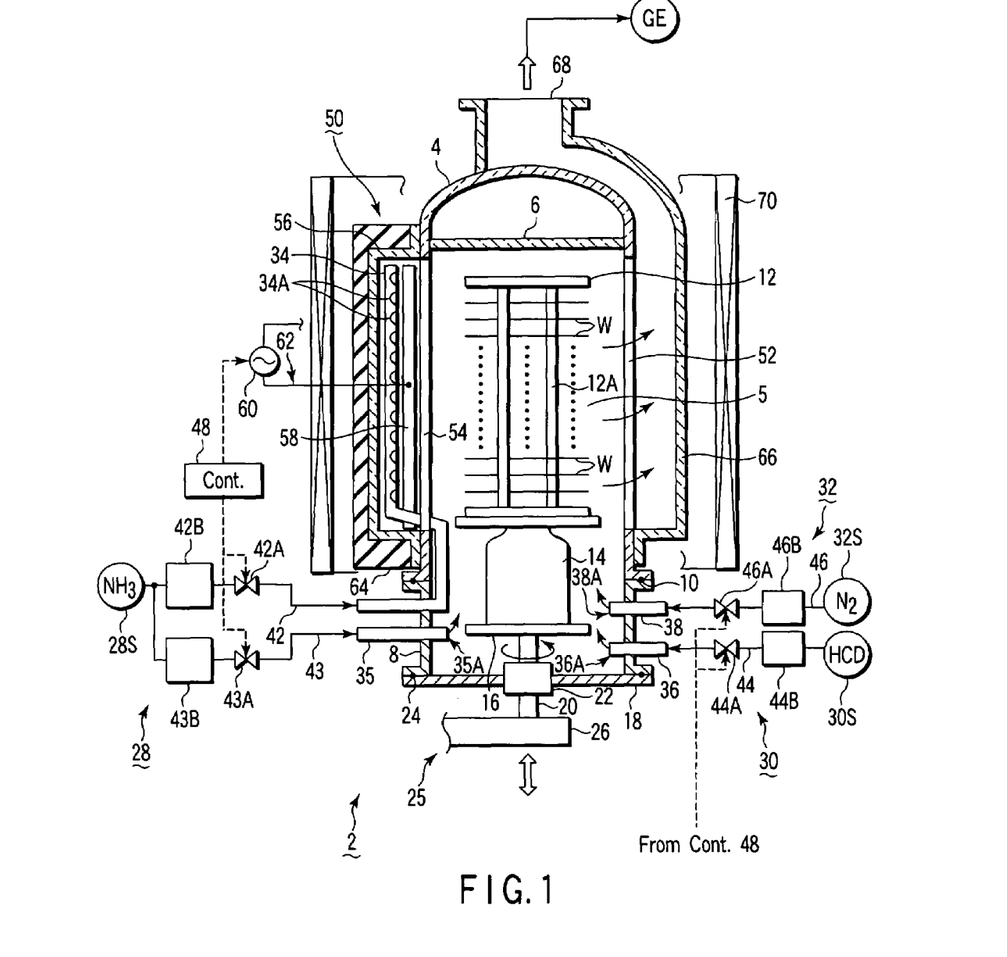
FIG. 1 is a sectional view showing a film formation apparatus (vertical CVD apparatus) according to a first embodiment of the present invention.
Figure 2:
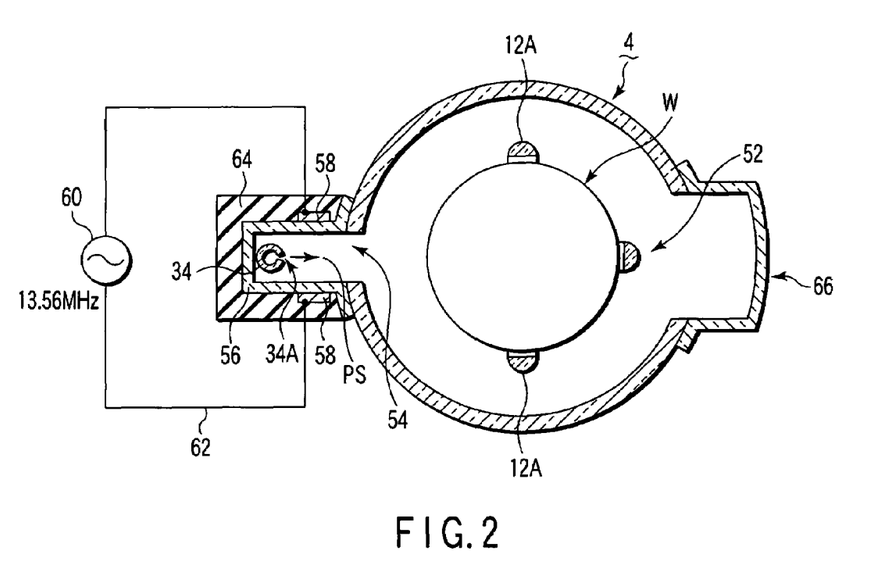
FIG. 2 is a sectional plan view showing part of the apparatus shown in FIG. 1.

FIG. 1 is a sectional view showing a film formation apparatus (vertical CVD apparatus) according to a first embodiment of the present invention. FIG. 2 is a sectional plan view showing part of the apparatus shown in FIG. 1. The film formation apparatus 2 is arranged to supply a source gas (first process gas) containing hexachlorodisilane (HCD) gas as a silane family gas, and an assist gas (second process gas) containing ammonia ($NH_3$) gas as a nitriding gas, to deposit a silicon nitride film (SiN).

The apparatus 2 includes a process container 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes an assist gas supply circuit (second process gas supply circuit and surface-treatment gas supply circuit) 28, a source gas supply circuit (first process gas supply circuit) 30, and an inactive gas supply circuit 32. The source gas supply circuit 30 is arranged to supply a source gas for film formation comprising a silane family gas, such as HCD (dichlorosilane) gas. The assist gas supply circuit 28 is arranged to supply an assist gas comprising, e.g., ammonia ($NH_3$) gas (used as a second process gas for reacting with the source gas, and as a surface-treatment gas for treating the surface of a silicon nitride film). The inactive gas supply circuit 32 is arranged to supply an inactive gas, such as $N_2$ gas. Each of the source gas and assist gas is mixed with a suitable amount of carrier gas, as needed. However, such a carrier gas will not be mentioned, hereinafter, for the sake of simplicity of explanation.

More specifically, the assist gas supply circuit 28 includes a first gas nozzle 34 used as part of the surface-treatment gas supply circuit, and a second gas nozzle 35 used as part of the second process gas supply circuit of a gas for reacting with the source gas. The first gas nozzle 34 is a gas distribution nozzle formed of a quartz pipe, which penetrates the sidewall of the manifold 8 from the outside and then turns and extends upward. The gas distribution nozzle 34 has a plurality of gas spouting holes 34A formed at predetermined intervals in the longitudinal direction (the vertical direction) over all the wafers W on the wafer boat 12. The gas spouting holes 34A deliver the assist gas almost uniformly in the horizontal direction, so as to form gas flows parallel to the wafers W on the wafer boat 12. On the other hand, the second gas nozzle 35 is a short gas nozzle formed of a quartz pipe, which penetrates the sidewall of the manifold 8 from the outside and has an opening 35A below the process field 5.

The source gas supply circuit 30 includes a short gas nozzle 36 formed of a quartz pipe, which penetrates the sidewall of the manifold 8 from the outside and has an opening 36A below the process field 5. The inactive gas supply circuit 32 includes a short gas nozzle 38 formed of a quartz pipe, which penetrates the sidewall of the manifold 8 from the outside and has an opening 38A below the process field 5. Although, FIG. 1 shows the gas nozzles 36 and 38 at positions opposite the gas nozzles 34 and 35, the gas nozzles 36 and 38 are disposed on the same side as the gas nozzles 34 and 35 in practice.

The nozzles 34 and 35 are connected to a common gas source 28S of $NH_3$ gas through gas supply lines (gas passages) 42 and 43. The nozzles 36 and 38 are connected to gas sources 30S and 32S of HCD gas and $N_2$ gas through gas supply lines (gas passages) 44 and 46, respectively. The gas supply lines 42, 43, 44, and 46 are provided with switching valves 42A, 43A, 44A, and 46A and flow rate controllers 42B, 43B, 44B, and 46B, such as mass flow controllers, respectively. With this arrangement, $NH_3$ gas, HCD gas, and $N_2$ gas can be supplied at controlled flow rates.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening 54 formed by cutting a predetermined width of the sidewall of the process container 4, in the vertical direction. The opening 54 is covered with a quartz cover 56 airtightly connected to the outer surface of the process container 4 by welding. The cover 56 has a vertical long and thin shape with a concave cross-section, so that it projects outward from the process container 4.

With this arrangement, the gas exciting section 50 is formed such that it projects outward from the sidewall of the process container 4 and is opened on the other side to the interior of the process container 4. In other words, the inner space of the gas exciting section 50 communicates with the process field 5 within the process container 4. The opening 54 has a vertical length sufficient to cover all the wafers W on the wafer boat 12 in the vertical direction.

A pair of long and thin electrodes 58 are disposed on the opposite outer surfaces of the cover 56, and face each other along the longitudinal direction (the vertical direction). The electrodes 58 are connected to an RF (radio frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 is bent outward in the radial direction of the process container 4, at a position lower than the lowermost wafer W on the wafer boat 12. Then, the gas distribution nozzle 34 vertically extends at the deepest position (the farthest position from the center of the process container 4) in the gas exciting section 50. As shown also in FIG. 2, the gas distribution nozzle 34 is separated outward from an area sandwiched between the pair of electrodes 58 (a position where the RF electric field is most intense), i.e., a plasma generation area PS where the main plasma is actually generated. The assist gas (surface-treatment gas) containing $NH_3$ gas is spouted from the gas spouting holes 34A of the gas distribution nozzle 34 toward the plasma generation area PS. Then, the assist gas is excited (decomposed or activated) in the plasma generation area PS, and is supplied in this state onto the wafers W on the wafer boat 12.

An insulating protection cover 64 made of, e.g., quartz is attached on and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust cover member 66 extends upward along the sidewall of the process container 4, and has a gas outlet 68 at the top of the process container 4. The gas outlet 68 is connected to a vacuum-exhaust system GE including a vacuum pump and so forth.

The process container 4 is surrounded by a heater 70, which is used for heating the atmosphere within the process container 4 and the wafers W. A thermocouple (not shown) is disposed near the exhaust port 52 in the process container 4 to control the heater 70.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE, gas exciting section 50, heater 70, and so forth, based on the stored process recipe and control data.

Next, an explanation will be given of a film formation method performed in the apparatus shown in FIG. 1. In summary, this film formation method first comprises a step of supplying a source gas (first process gas) containing a silane family gas and an assist gas (second process gas) containing a nitriding gas to the process field 5 accommodating wafers W to form a silicon nitride film on the wafers W by CVD (film deposition step). The method then comprises a step of supplying a surface-treatment gas containing a nitriding gas (which may be the assist gas) in an activated state to the process field 5 (while stopping supply of the source gas to the process field 5) to nitride the surface of the silicon nitride film (surface nitridation step).

Specifically, at first, the wafer boat 12 at room temperature, which supports a number, e.g., 50 to 100, of wafers having a diameter of 300 mm, is loaded into the process container 4 heated at a predetermined temperature. Then, the interior of the process container 4 is vacuum-exhausted and kept at a predetermined process pressure, and the wafer temperature is increased to a process temperature for film formation. At this time, the apparatus is in a waiting state until the temperature becomes stable.

Then, a film deposition step is performed to deposit a silicon nitride film on the wafers W. In this step, the source gas containing HCD gas and the assist gas containing $NH_3$ gas are supplied into the process container 4 through the respective gas distribution nozzles 36 and 35 at controlled flow rates, while the interior of the process container 4 is vacuum-exhausted. At this time, the gas distribution nozzle 34 is not used, and thus the assist gas is supplied only through the gas nozzle 35 from below the process field 5. The source gas is also supplied through the gas nozzle 36 from below the process field 5. By the agency of vacuum-exhaust given by the vacuum-exhaust system GE, the source gas and assist gas are drawn upward in the process field 5 and flow in the gaps between the wafers W supported on the wafer boat 12 being rotated. At this time, the source gas and assist gas cause a thermal decomposition reaction, and a silicon nitride film is thereby formed on the wafers W by CVD. In this film deposition step, $N_2$ gas may be simultaneously supplied through the gas nozzle 38 of the inactive gas supply circuit 32, as needed.

After the film deposition step, a purge step is performed to remove the residual gas within the process container 4. In this step, $N_2$ gas is supplied as a purge gas into the process container 4 through the gas nozzle 38, while the interior of the process container 4 is kept vacuum-exhausted.

After performing the cycle purge step, a surface nitridation step is performed to nitride the surface of the silicon nitride film. In this step, the assist gas containing $NH_3$ gas is supplied as a surface-treatment gas into the process container 4, while supply of the source gas is stopped. At this time, the gas nozzle 35 is not used, and thus the assist gas is supplied only through the gas distribution nozzle 34 from a lateral side of the process field 5. Further, the gas exciting section 50 is set in the ON-state to activate the assist gas and thereby promote the nitridation treatment. Also in this surface nitridation step, $N_2$ gas may be simultaneously supplied through the gas nozzle 38 of the inactive gas supply circuit 32, as needed.

In the surface nitridation step, the assist gas (surface-treatment gas) supplied from the gas spouting holes 36A of the gas distribution nozzle 34 is selectively excited and partly turned into plasma when it passes through the plasma generation area PS between the pair of electrodes 58. At this time, for example, radicals (activated species), such as $N^*$, $NH^*$, $NH_2^*$, and $NH_3^*$, are produced (the symbol [*] denotes that it is a radical). The radicals flow out from the opening 54 of the gas exciting section 50 toward the center of the process container 4, and are supplied into gaps between the wafers W in a laminar flow state. Radicals thus supplied nitride the surface of the silicon nitride film on the wafers W, whereby most of Si—H bonds on the film surface are changed to Si—N bonds, thereby making the surface free from residual gas components.

Figure 3:
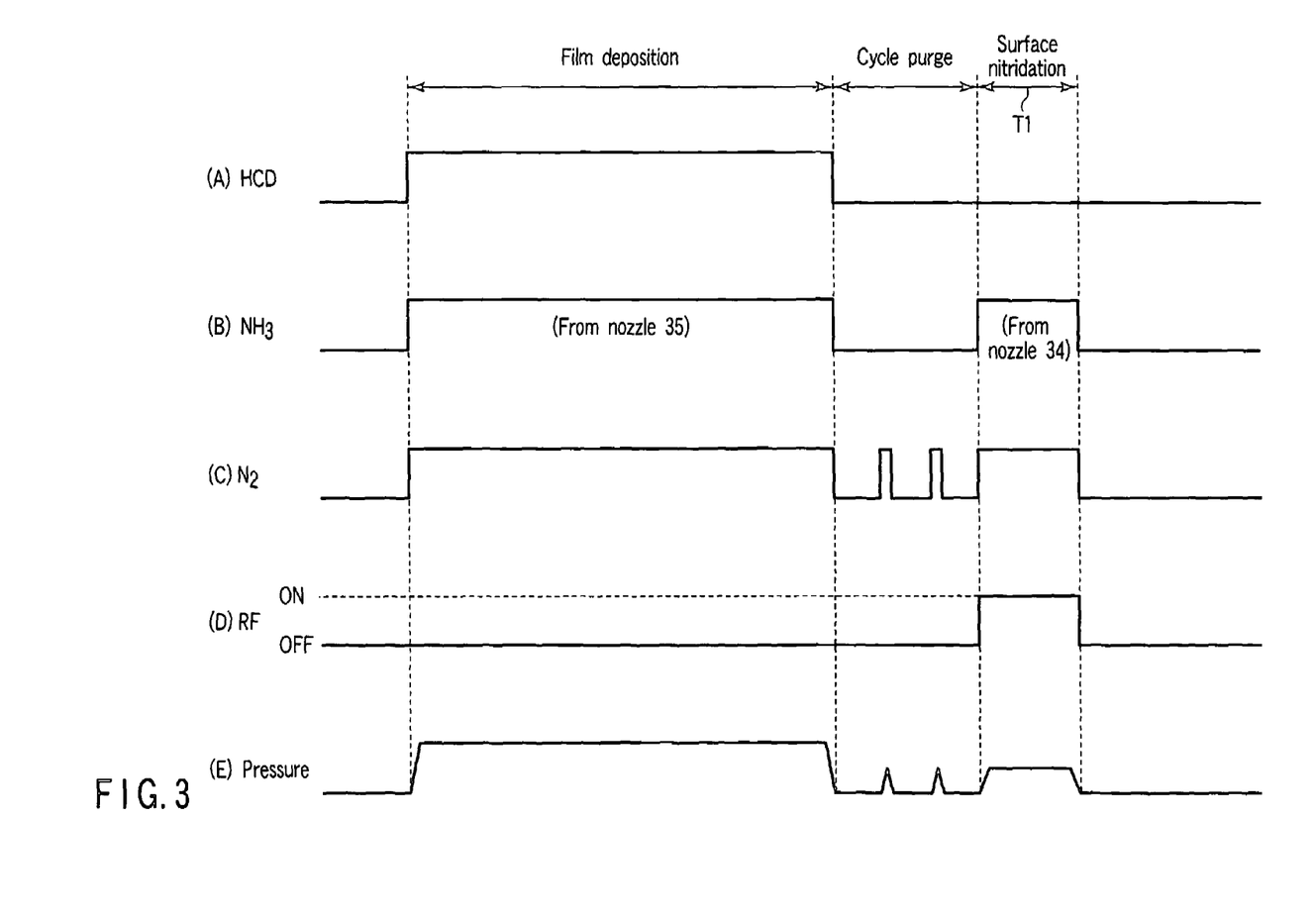
FIG. 3 is a timing chart of the gas supply and RF (radio frequency) application of a film formation method according to the first embodiment.

FIG. 3 is a timing chart of the gas supply and RF (radio frequency) application of a film formation method according to the first embodiment. As shown in FIG. 3, a film deposition step is first performed. In this step, the source gas (denoted as HCD in FIG. 3) and the assist gas (denoted as $NH_3$ in FIG. 3) are supplied to the process container 4 (see FIG. 3, (A) and (B)), which is being vacuum-exhausted. The source gas and assist gas are supplied through the gas nozzles 36 and 35 from below the process field 5, and flow upward in the process field 5, during which a silicon nitride film is formed on the surface of the wafers W by CVD. At this time, an inactive gas (denoted as $N_2$ in FIG. 3) is also simultaneously supplied through the gas nozzle 38, as needed, (see FIG. 3, (C)). This CVD process is performed at a relatively low temperature, i.e., the temperature of the wafers W is not so high.

After the film deposition step by low temperature CVD, a cycle purge step is performed to remove the residual process gas within the process container 4. In this step, while continuing vacuum-exhaust, supply and stop of $N_2$ gas through the gas nozzle 38 are repeated pulse-wise several times (see FIG. 3, (C)).

After the cycle purge step, a surface nitridation step is performed to nitride the surface of the silicon nitride film. In this step, while continuing vacuum-exhaust, the assist gas containing $NH_3$ gas is supplied as a surface-treatment gas, not through the nitriding gas nozzle 35, but through the gas spouting holes 34A of the nitriding gas distribution nozzle 34 extending upward within the container 4. At this time, the RF power supply 60 is set in the ON-state to activate $NH_3$ gas by generating plasma (see FIG. 3, (D)). With the activated $NH_3$ gas thus supplied, the surface of the silicon nitride film is almost completely nitrided. At this time, an inactive gas is also simultaneously supplied through the gas nozzle 38, as needed, (see FIG. 3, (C)).

In the case of conventional film formation methods, a silicon nitride film formed by the process causes degasification from the wafer surface, and thereby generates gases containing, e.g., SiH or $SiH_2$ as the main component, which then react with oxygen or the like and form particles. In contrast, according to this embodiment, since the surface of a silicon nitride film is further subjected to a nitridation treatment, until most of the Si—H bonds on the surface are changed to Si—N bonds, the surface can be essentially free from residual gas components. Consequently, when the silicon nitride film is exposed to atmosphere, no degasification occurs, thereby preventing particle generation on the wafer surface.

In this embodiment, the process conditions of the film deposition step are as follows. The flow rate of HCD gas is set to be within a range of 5 to 50 sccm, e.g., at 20 sccm. The flow rate of $NH_3$ gas is set to be within a range of 100 to 5,000 sccm, e.g., at 2,000 sccm. The process pressure is set to be within a range of 13 to 1,330 Pa, e.g., at 200 Pa (1.5 Torr). The process temperature is set to be 550° C. or less, e.g., at 480° C. If the process temperature is higher than 550° C., although the film quality is improved, a thermal damage is applied to the material of underlying layers on the wafers. The lower limit of the process temperature is about 300° C. If the process temperature is lower than 300° C., essentially no film is deposited. The process time depends on a target film thickness. For example, where the target film thickness is about 35 nm, the process time is about 40 minutes.

In this embodiment, the process conditions of the surface nitridation step are as follows. The flow rate of $NH_3$ gas is set to be within a range of 100 to 5,000 sccm, e.g., at 2,000 sccm (the same as that in the film deposition step). If the flow rate of $NH_3$ gas is lower than the lower limit, it is difficult to obtain sufficient nitridation. If the flow rate of $NH_3$ gas is higher than the upper limit, the gas is wastefully used because of saturation of nitridation reaction. The process pressure is set to be within a range of 13 Pa (0.1 Torr) to 2,660 Pa (20 Torr), e.g., at 13.3 Pa. If the process pressure is lower than 13 Pa, it is difficult to obtain sufficient nitridation because the pressure is too low. If the process pressure is higher than 2,660 Pa, it is difficult to generate plasma. The process temperature is set to be not higher than that of the film deposition step described above, and preferably equal to that of the film deposition step to exclude a time period for temperature increase. The process time T1 of the surface nitridation step is set to be far shorter than that of the film deposition step. However, the process time T1 is set to be 1 minute or more, e.g., at 10 minutes. If the process time T1 is shorter than 1 minute, it is difficult to obtain sufficient nitridation.

<Experiment 1>

An experiment 1 was conducted to examine the first embodiment. As a comparative example, a silicon nitride film was formed on a wafer surface by a conventional CVD method, and then the wafer was placed in a clean air for 8 hours. As a result, the number of particles was 13 at first, and then increased to 17,663 after 8 hours. On the other hand, as a present example according to the first embodiment, a silicon nitride film was deposited on a wafer surface and subjected to surface nitridation immediately thereafter, and then the wafer was placed in a clean air for 8 hours. As a result, the number of particles was 30 at first, and then increased to 41 after 8 hours. Accordingly, it has been confirmed that particle generation can be remarkably suppressed by the first embodiment.

In the first embodiment, the exciting section 50 for generating plasma of the film formation apparatus 2 is integrally combined with the process container 4. Alternatively, the exciting section 50 may be separately disposed from the process container 4, so as to excite $NH_3$ gas outside the process container 4 (so-called remote plasma), and then supply the excited $NH_3$ gas into the process container 4.

Second Embodiment

Figure 4:
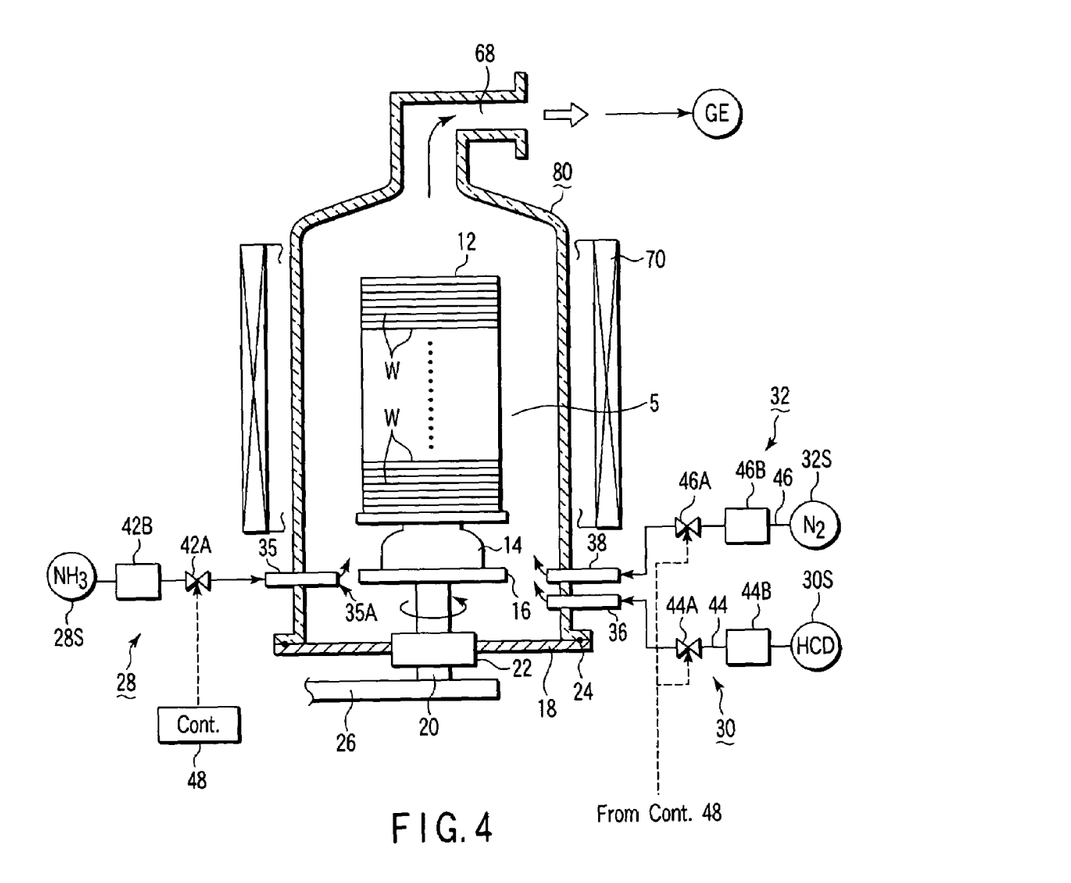
FIG. 4 is a sectional view showing a film formation apparatus (vertical CVD apparatus) according to a second embodiment of the present invention.

FIG. 4 is a sectional view showing a film formation apparatus (vertical CVD apparatus) according to a second embodiment of the present invention. A surface nitridation step for the purpose described above may be performed by increasing the pressure of a nitriding gas to promote nitridation, in place of activating the nitriding gas by plasma. The second embodiment is arranged in light of this aspect.

As shown in FIG. 4, this film formation apparatus has a process container 80 of a single tube type, the entirety of which is integrally made of quartz, including the portion corresponding to the manifold 8 shown in FIG. 1. The process container 80 is not provided with the gas exciting section 50 for generating plasma, members associated therewith, or the exhaust cover member 66, shown in FIG. 1, and thus the process container 80 is completely cylindrical. The assist gas supply circuit 28 does not include the gas distribution nozzle 34 shown in FIG. 1, but includes only a straight nozzle 35 for a nitriding gas. $NH_3$ gas and HCD gas are supplied from the bottom of the process container 80 and flow upward while coming into contact with wafers W within the process container 80. At this time, these gases are not laterally drawn (see FIG. 1), but are exhausted out of the container through an exhaust port 68 formed at the ceiling.

Figure 5:
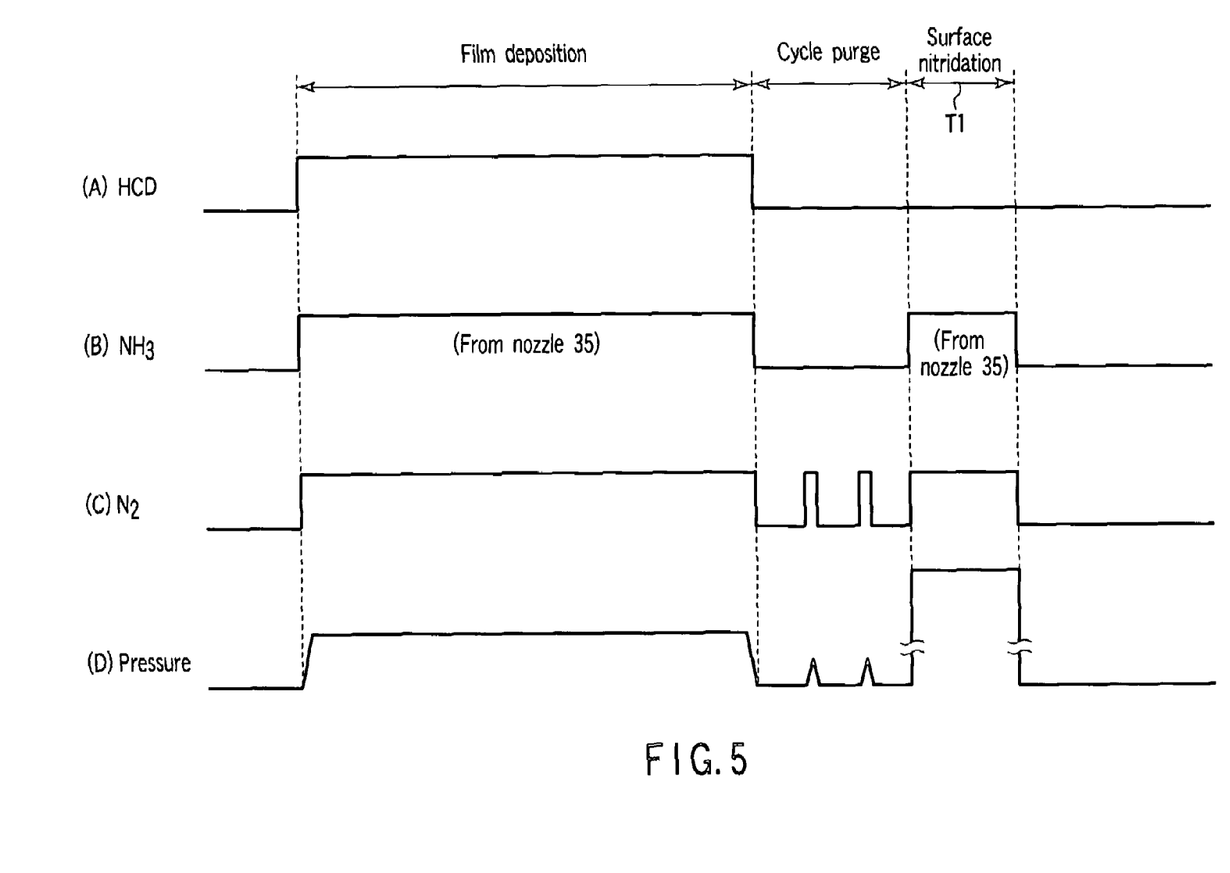
FIG. 5 is a timing chart of the gas supply of a film formation method according to the second embodiment.

FIG. 5 is a timing chart of the gas supply of a film formation method according to the second embodiment. As shown in FIG. 5, this film formation method includes a film deposition step and a cycle purge step the same as those of the film formation method shown in FIG. 3. On the other hand, the surface nitridation step of this method is arranged such that the surface of a silicon nitride film is subjected to a nitridation treatment, without generating plasma, while the assist gas containing $NH_3$ gas (denoted as $NH_3$ in FIG. 5) is supplied as a surface-treatment gas, and $N_2$ gas may be supplied, as needed. In other words, the assist gas is supplied into the process field under essentially the same activating condition between the film deposition step (supplied as the second process gas) and the surface nitridation step (supplied as the surface-treatment gas).

However, the surface nitridation step is arranged to increase the pressure inside the process container 80 (see FIG. 5, (D)), in order to promote nitridation reaction. The process pressure at this time is set to be 2,660 Pa (20 Torr) or more to meet this purpose, e.g., at 120 Torr. If the process pressure is lower than 20 Torr, it is difficult to obtain sufficient nitridation. The process time T1 of the surface nitridation step is set to be far shorter than that of the film deposition step. However, the process time T1 is set to be 1 minute or more, e.g., at 10 minutes.

Common Matters and Modifications of First and Second Embodiments

Figure 6:
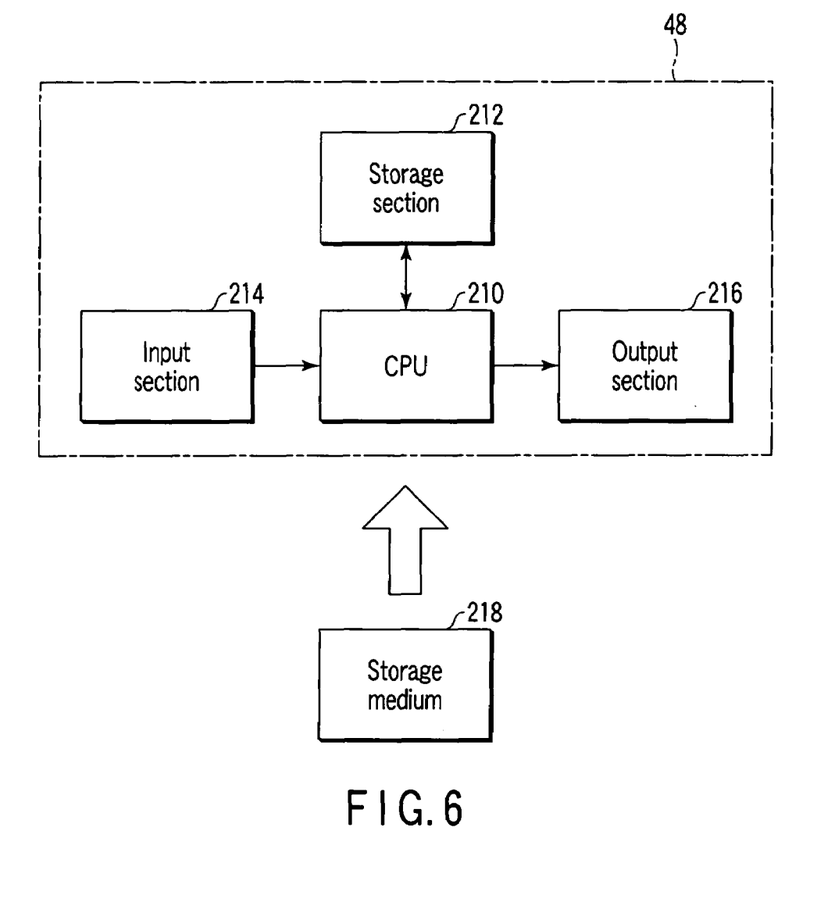
FIG. 6 is a block diagram schematically showing the structure of a main control section.

Each of the methods according to the first and second embodiment is performed under the control of the main control section 48 in accordance with a process program, as described above. FIG. 6 is a block diagram schematically showing the structure of the main control section 48. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 6 also shows a storage medium 218 attached to the computer in a removable state.

Each of the methods according to the first and second embodiment may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.)., an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the first and second embodiments, HCD gas is used as a silane family gas, and $NH_3$ gas is used as a nitriding gas. In this respect, the source gas may comprise one or more gases selected from the group consisting of dichlorosilane (DCS), hexachlorodisilane (HCD), monosilane ($SiH_4$), disilane ($Si_2Cl_6$), hexamethyldisilazane (HMDS), tetrachlorosilane (TCS), disilylamine (DSA), trisilylamine (TSA), bistertialbutylaminosilane (BTBAS).

In the first and second embodiments, the nitriding gas may comprise $NH_3$ gas or $N_2$ gas. The film deposition step (second process gas) and the surface nitridation step (surface-treatment gas) may employ different nitriding gases. Where the present invention is applied to formation of a silicon oxynitride film, the assist gas may comprise an oxynitriding gas, such as dinitrogen oxide ($N_2O$) or nitrogen oxide (NO). A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a silicon nitride film, comprising:
   depositing a silicon nitride film on a target substrate by CVD in a process field within a reaction container, while supplying a silane family gas and an ammonia gas to the process field, and setting the process field at a first temperature and a first pressure, for a first time period;
   then, purging the process field while shutting off a supply of the silane family gas and the ammonia gas to the process field; and
   then, nitriding a surface of the silicon nitride film in the process field, while supplying the ammonia gas to the process field without supplying the silane family gas, and setting the process field at a second temperature and a second pressure, for a second time period shorter than the first time period.

2. The method according to claim 1, wherein the first temperature is set to be 550° C. or less, and the second temperature is set to be equal to or lower than the first temperature.

3. The method according to claim 1, wherein said depositing a silicon nitride film and said nitriding a surface of the silicon nitride film are arranged to supply ammonia gas, in substantially the same activating condition as each other, to the process field, the first pressure is set to be within a range of 13 Pa (0.1 Torr) to 1,330 Pa (10 Torr), and the second pressure is set to be 2,660 Pa (20 Torr) or more.

4. The method according to claim 1, wherein said nitriding a surface of the silicon nitride film comprises a period of supplying the ammonia gas to the process field while exciting the ammonia gas by an exciting mechanism, and the second pressure is set to be within a range of 13 Pa (0.1 Torr) to 2,660 Pa (20 Torr).

5. The method according to claim 4, wherein the exciting mechanism comprises a plasma generation area disposed in a space communicating with the process field and between a supply port of the ammonia gas and the target substrate, and the ammonia gas is excited while passing through the plasma generation area in nitriding the surface of the silicon nitride film.

6. The method according to claim 5, wherein the process field is configured to accommodate a plurality of target substrates at intervals in a vertical direction, the supply port comprises a plurality of gas spouting holes to form gas flows parallel to the target substrates, and the gas spouting holes are arrayed over the target substrates in a vertical direction.

7. The method according to claim 6, wherein a lower supply port configured to supply the ammonia gas the gas is disposed below the process field, and the ammonia gas is supplied from the lower supply port in depositing the silicon nitride film.

8. The method according to claim 1, wherein the second time period is set to be 1 minute or more.

9. The method according to claim 1, wherein the silane family gas comprises at least one gas selected from the group consisting of dichlorosilane, hexachlorodisilane, monosilane, disilane, hexamethyldisilazane, tetrachlorosilane, disilylamine, trisilylamine, and bistertialbutylaminosilane.

10. The method according to claim 1, wherein said purging the process field comprises performing a cycle purge by pulse-wise repeating supply and stop of an inactive gas to the process field a plurality of times while continuing vacuum-exhaust of the process field.

11. A method for forming a silicon nitride film by a vertical heat processing apparatus including a reaction container, which defines a process field configured to accommodate a plurality of target substrates at intervals in a vertical direction, the method comprising:
    depositing a silicon nitride film on the target substrates by CVD in the process field, while supplying a silane family gas and an ammonia gas to the process field, and setting the process field at a first temperature and a first pressure, for a first time period;
    then, purging the process field while shutting off supply of the silane family gas and the ammonia gas to the process field; and
    then, nitriding a surface of the silicon nitride film in the process field, while supplying the ammonia gas to the process field without supplying the silane family gas, and setting the process field at a second temperature and a second pressure, for a second time period shorter than the first time period,
    wherein said nitriding a surface of the silicon nitride film is arranged to supply the ammonia gas from a plurality of gas spouting holes arrayed over the target substrates in a vertical direction and configured to form gas flows parallel to the target substrates, and
    said nitriding a surface of the silicon nitride film comprises a period of supplying the ammonia gas to the process field while exciting the ammonia gas by an exciting mechanism that comprises a plasma generation area disposed in a space communicating with the process field and between the gas spouting holes and the target substrate.

12. The method according to claim 11, wherein the first temperature is set to be 550° C. or less, and the second temperature is set to be equal to or lower than the first temperature, and wherein the first pressure is set to be within a range of 13 Pa (0.1 Torr) to 1,330 Pa (10 Torr), and the second pressure is set to be within a range of 13 Pa (0.1 Torr) to 2,660 Pa (20 Torr).

13. The method according to claim 12, wherein the second time period is set to be 1 minute or more.

14. The method according to claim 12, wherein the silane family gas comprises at least one gas selected from the group consisting of dichlorosilane, hexachlorodisilane, monosilane, disilane, hexamethyldisilazane, tetrachlorosilane, disilylamine, trisilylamine, and bistertialbutylaminosilane.

15. The method according to claim 11, wherein said purging the process field comprises performing a cycle purge by pulse-wise repeating supply and stop of an inactive gas to the process field a plurality of times while continuing vacuum-exhaust of the process field.

* * * * *